US005119430A

United States Patent [19]

Peavey et al.

[11] Patent Number: 5,119,430

[45] Date of Patent: Jun. 2, 1992

[54] SOUND AMPLIFIER SYSTEM

[75] Inventors: Hartley D. Peavey; Jack C. Sondermeyer; James W. Brown; Ronald D. Goss, all of Meridian, Miss.

[73] Assignee: Peavey Electronics Corporation, Meridian, Miss.

[21] Appl. No.: 465,400

[22] Filed: Jan. 16, 1990

[51] Int. Cl.[5] .......... H03F 21/00

[52] U.S. Cl. .......... 381/121; 381/93

[58] Field of Search .......... 381/88, 90, 205, 188, 381/83, 93

[56] References Cited

U.S. PATENT DOCUMENTS

| | | | |
|---|---|---|---|
| 2,231,235 | 2/1941 | Weir | 206/13 |
| 2,812,382 | 11/1957 | Michael | 381/90 |
| 3,183,305 | 5/1965 | Jespersen . | |
| 3,473,625 | 10/1969 | Heisrath | 381/90 |
| 3,514,539 | 5/1970 | Jespersen . | |
| 3,860,755 | 1/1975 | Kimbell . | |

FOREIGN PATENT DOCUMENTS 0219289 9/1986 Japan .

*Primary Examiner*—Forester W. Isen

*Attorney, Agent, or Firm*—Watson, Cole, Grindle & Watson

[57] ABSTRACT

An amplifier using vacuum tubes is mounted in a housing with a speaker in such a way as to minimize microphonics by having the speaker axis and all vacuum tube axes parallel.

8 Claims, 2 Drawing Sheets

SOUND AMPLIFIER SYSTEM

BACKGROUND OF THE INVENTION

The present invention relates to a sound amplifier system especially adapted for use with musical instruments, and in particular electric guitars.

The invention is directed to the problems encountered with sound amplifier systems often referred to as single-unit vacuum tube amplifiers. This type of system includes a housing or cabinet which supports a loudspeaker means and an amplifier means as an integral unit wherein the components are mechanically interconnected with one another. The amplifier means in this type of system includes conventional vacuum tubes which are incorporated in the low level preamplifier and power amplifier portions of the amplifier means.

Sound amplifier systems utilized with electric guitars are usually operated at nearly maximum gain in order to provide the desired tube-type distortion that is so popular in contemporary music. The requirement for high gain coupled with the high efficiency loudspeakers in current use and the generally poor quality of vacuum tubes which are now mostly imported creates a tremendous problem referred to as "tube microphonics". This is actually spurious mechanical noise generated within the vacuum tubes during operation of the sound system.

Conventional vacuum tubes employed in this type of sound system include internal elements including the usual cathode, grid and plate. These elements are concentrically disposed with respect to the longitudinal axis of the tube, the construction being such that the tube has its maximum strength and rigidity along such longitudinal axis. Any movement of a tube element or its respective support structures with respect to any other element is amplified and passes through the loudspeaker as an objectionable noise and/or high pitched squeal, referred to as tube feedback.

Movement of the tube elements is caused by motion of the loudspeaker during operation of the system. The loudspeaker is mechanically coupled to the vacuum tubes through the housing and chassis of the amplifier means. In addition, the loudspeaker produces intense air pressure waves within the housing, and these air pressure waves may impinge on the tube so as to cause movement of the tube elements. The tubes literally act like a microphone and pick up vibrations caused by motion of the loudspeaker which are transmitted both mechanically and pneumatically to the tubes.

Many efforts have been made to reduce tube microphonics in this type of sound system, but have been unsatisfactory. In present day sound systems, the loudspeakers are mounted within an associated housing so that the main axis of motion of each of the loudspeakers is disposed in a substantially horizontal position. The vacuum tubes of the amplifier means are mounted such that longitudinal axes thereof extend substantially vertically, or substantially perpendicular to the main axis of motion of the loudspeakers of the system.

The prior art has taught that the vacuum tubes should be mounted with the longitudinal axes thereof disposed substantially vertically to obtain convection cooling thereof due to the so-called "chimney effect" wherein the hot air rising off of the tubes is replaced by cooler air from below. Additionally, by having the tubes oriented in this manner, it is much simpler to remove and replace the vacuum tubes when necessary.

It has been discovered that the orientation of the vacuum tubes in the prior as discussed above resulted in vibrations being coupled to the vacuum tubes from the moving loudspeaker both mechanically and pneumatically in a direction substantially perpendicular to the longitudinal axes of the vacuum tubes. Since the tubes do not have great strength and rigidity in a direction perpendicular to the longitudinal axes thereof, excessive vibrations were induced in the internal elements of the tubes, thereby causing undesired tube microphonics.

Although not previously recognized, this is true when the vacuum tubes are disposed with the longitudinal axes thereof disposed substantially vertically and wherein the tubes extend into the path of the air pressure waves generated by the loudspeaker. The tubes in modern sound systems of this type are disposed behind the speaker and in the path of the air pressure waves which impinge thereon in a direction generally perpendicular to the longitudinal axes of the tubes. Furthermore, the vibrations of the speaker which are transmitted mechanically through the housing are constrained to be disposed in a substantially horizontal direction since the housing is supported on a horizontal surface. These mechanically transmitted vibrations accordingly occur in a direction disposed substantially perpendicular to the axis of the tubes.

In a prior art arrangement as shown in United States Pat. No. 2,231,235, the vacuum tubes of the amplifier means are disposed horizontally rather than vertically when the sound system is in operative position. However, vibrations imparted to the vacuum tubes due to motion of the loudspeaker are in a direction substantially perpendicular to the longitudinal axes of the tubes, thereby causing excessive vibration of the tube elements and undesired tube microphonics.

SUMMARY OF THE INVENTION

In the system of the present invention, the components have a novel interrelationship with respect to one another. The housing has a substantially horizontally disposed support surface, and each tube of the amplifier means is supported such that the longitudinal axis thereof along which it has maximum strength and rigidity is disposed substantially parallel with a vertical plane passing through the main axis of motion of the loudspeaker means supported by the housing.

This unique disposition of the vacuum tubes of the amplifier means with respect to the remaining components of the system ensures that any vibrations transmitted either mechanically or pneumatically from the loudspeaker means to the vacuum tubes will be in a direction substantially parallel with the longitudinal axes of the vacuum tubes. Since the vibrations are in the direction of maximum strength and rigidity of the tubes, any movement of the internal elements of the vacuum tubes will be minimized, thereby causing undesired tube microphonics to be reduced to a minimum.

A further feature of the invention is the arrangement wherein a portion of the chassis of the amplifier means is disposed between the loudspeaker means and the vacuum tubes for minimizing impingement on the vacuum tubes of air pressure waves generated by motion of the loudspeaker means. This ensures that the air pressure waves will have only a very minor effect, if any, on the vacuum tubes.

It is additionally noted that the position of the vacuum tubes and the loudspeaker means in the present invention enables the loudspeaker means to be spaced a substantial distance from the tubes to lessen the likelihood of the air pressure waves generated by motion of the loudspeaker means having any effect on the tubes.

The present invention arises from the recognition for the first time in the art that the orientation of the vacuum tubes of the amplifier means relative to the remaining components of the system is critical, and that when properly oriented as discussed above, an entirely new level of performance is attained while at the same time minimizing the effects of tube microphonics.

DESCRIPTION OF THE PREFERRED EMBODIMENT

Figure 1:
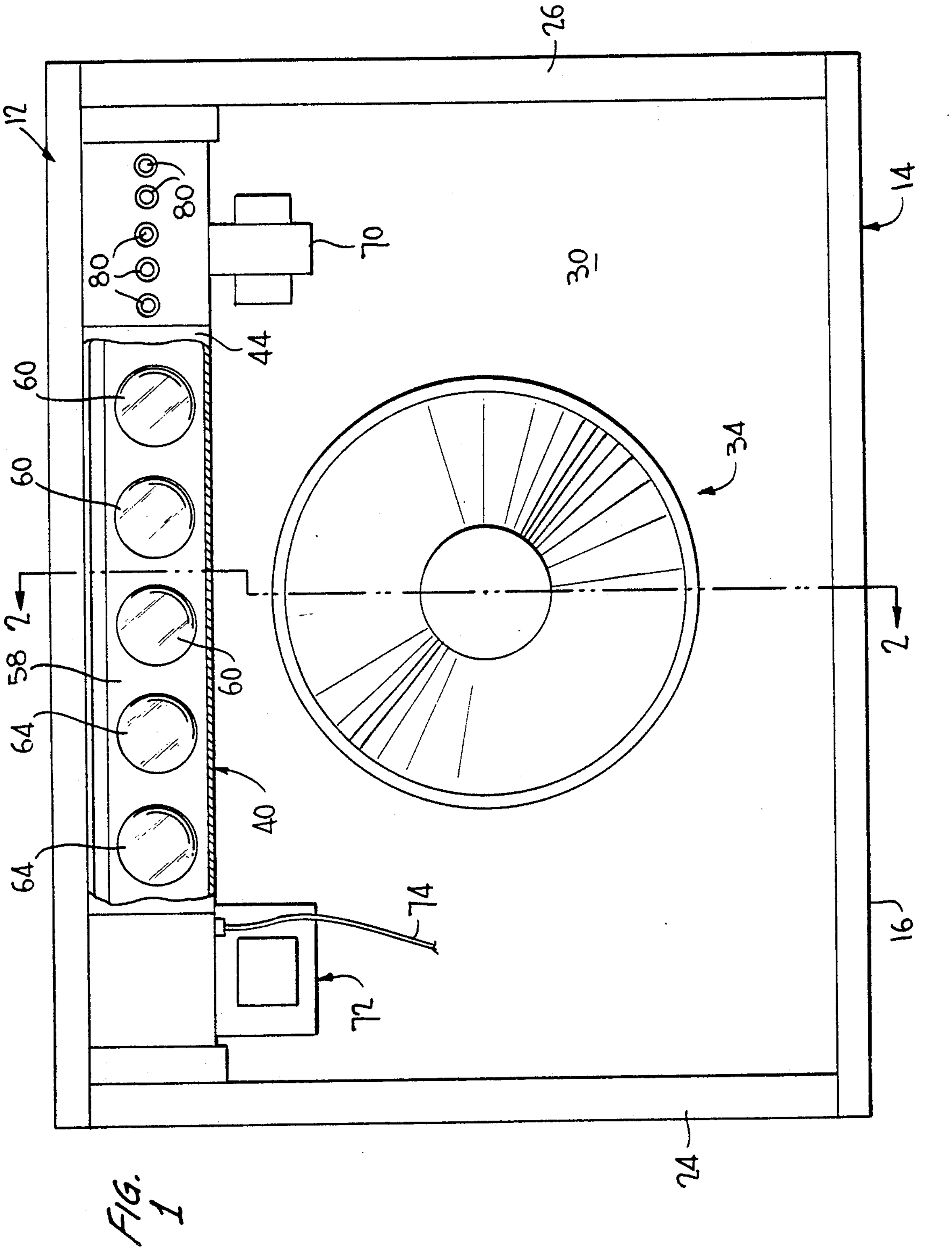
FIG. 1 of the drawings is a somewhat schematic view of the rear view of a sound system according to the invention.
Figure 2:
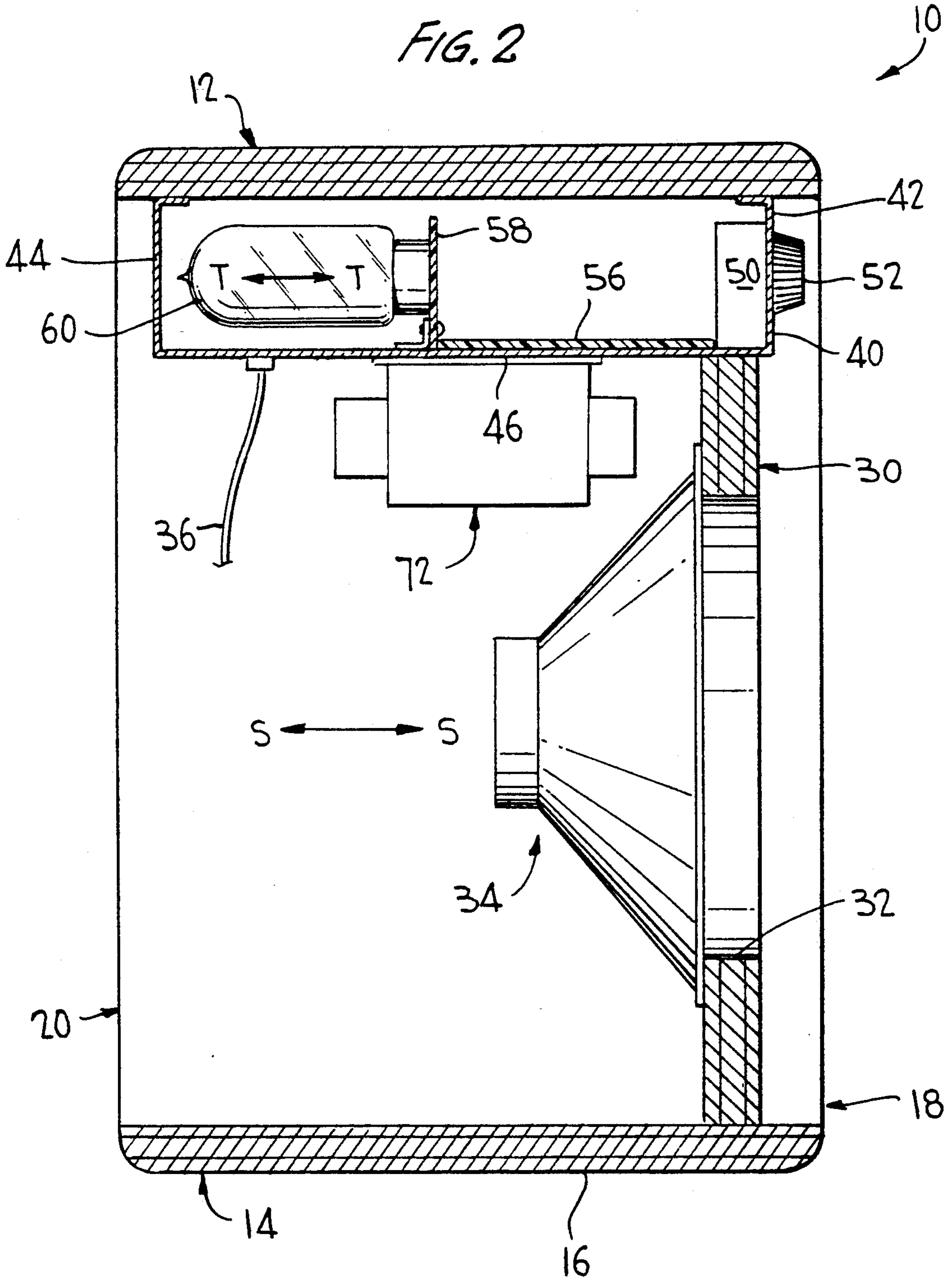
FIG. 2 is a cross-section taken along line 2-2 of FIG. 1 looking in the direction of the arrows.

Referring now to the drawings wherein like reference characters designate corresponding parts throughout, a housing 10 commonly formed of plywood or other suitable material has a top portion or wall 12 and an opposite lower portion or wall 14 which has on the bottom thereof a support surface 16 which is normally horizontally disposed. The housing also includes a front portion 18 and an opposite rear portion 20. The rear portion is shown as being completely open, although it may be partially closed as is well-known in the art. The housing also includes opposite side portions or walls 24 and 26.

A conventional baffle board 30 is supported between the opposite sides of the housing and has a hole 32 formed therethrough. A conventional loudspeaker means 34 is mounted on the baffle board in the usual manner. The loudspeaker means has a main axis of motion as indicated by the double headed arrow S-S indicating the direction of vibrations of the loudspeaker means. The electrical connections to the loudspeaker means are conventional and are not shown for the sake of clarity.

An amplifier means chassis 40 includes a front wall 42 disposed adjacent the front portion of the housing and a rear wall 44 disposed adjacent the rear portion of the housing. The front and rear walls are interconnected by an integral bottom wall 46. The chassis is supported adjacent the undersurface of top wall 12 of the housing in a conventional manner. A conventional control means 50 such as a volume control is supported by the chassis adjacent front wall 42 and is provided with a control knob 52 for operating the control means. The amplifier means includes conventional printed circuit boards 56 and 58 supported on the chassis in a known manner. Board 58 is supported so as to extend in a generally vertical direction and is provided with suitable sockets for supporting the vacuum tubes of the amplifier circuit therein.

Three conventional preamplifier vacuum tubes 60 are supported by board 58, and two conventional power amplifier tubes 64 are supported by the board. The tubes have a longitudinal axis which along which it has maximum strength and rigidity, this axis being indicated by the double arrow T-T which indicates the direction in which the tube will vibrate in response to motion of the loudspeaker means. It will be noted that the axes of all of the tubes are substantially parallel with one another and are disposed substantially parallel with a vertical plane passing through the main axis of motion S-S of the loudspeaker means. Accordingly, any vibrations transmitted to the vacuum tubes either mechanically through the structural interconnection of the loudspeaker means with the tubes or pneumatically by air pressure waves produced within the housing will be in a direction substantially parallel with the longitudinal axis of the tubes. Since the tubes have maximum strength and rigidity in this direction, movement of the internal elements of the tubes will be minimized.

The vibrations which are transmitted mechanically to the tubes are constrained to be in a direction substantially parallel with the support surface, and the vibrations which are transmitted pneumatically by the air pressure waves have a major component in a direction parallel with the main axis of movement S-S of the loudspeaker means.

The bottom wall 46 of the amplifier means chassis is disposed between the loudspeaker means and the vacuum tubes to provide a shield to protect the tubes from impingement by the air pressure waves produced by the loudspeaker means. It is contemplated that bottom wall 46 will have some holes formed therethrough to facilitate cooling of the components supported by the chassis, and accordingly, the tubes may not be completely shielded. However, any holes formed through bottom wall 46 will be a very minor part of the total area of the bottom wall, and accordingly impingement on the vacuum tubes of air pressure waves generated by motion of the loudspeaker means will be reduced to a minimum.

A pair of transformers 70 and 72 are supported from the bottom wall of the chassis, and a conventional line cord 74 is electrically connected to the amplifiermeans and has a plug at the opposite end thereof (not shown) which can be inserted in an electrical wall socket. A plurality of conventional jacks 80 are provided which can be connected to a musical instrument or the like.

The invention has been described with reference to a preferred embodiment. Obviously, modifications and alterations will occur to others. It is our intention to include all such modifications and alterations insofar as they come within the scope of the appended claims or the equivalent thereof.

What is claimed is:

1. A sound amplifier system comprising a housing, loudspeaker means supported by said housing, said loudspeaker means having a main axis of motion, amplifier means supported by said housing, said amplifier means including a plurality of vacuum tubes including power amplifier tubes and preamplifier tubes, each of said tubes having a longitudinal axis along which the tube has maximum strength and rigidity, the longitudinal axes of all of said vacuum tubes being substantially parallel with one another and being parallel with said axis of the loudspeaker means so as to minimize movement of said internal elements of the vacuum tubes caused by motion of said loudspeaker means and thereby reduce undesired tube microphonics to a minimum.

2. A system as defined in claim 1 wherein said amplifier means includes a chassis supported by said housing, said chassis including a wall disposed between said loudspeaker means and said vacuum tubes, said wall including a very major portion which is uninterrupted and free of holes to shield the tubes and minimizing impingement upon said vacuum tubes of air pressure waves generated by motion of said loudspeaker means.

3. A sound amplifier system comprising a housing, loudspeaker means supported within said housing and connected thereto so that vibrations of said loudspeaker means are mechanically transmitted to said housing in a first direction, motion of said loudspeaker means creating air pressure waves within said housing, amplifier means supported within said housing and connected thereto so that vibrations of said housing are transmitted to said amplifier means, said amplifier means including chassis means and a plurality of vacuum tubes including power amplifier tubes and preamplifier tubes, each of said tubes having a longitudinal axis along which the tube has maximum strength and rigidity, the longitudinal axes of all of said vacuum tubes being substantially parallel with one another and with said first direction so as to minimize movement of said internal elements of the vacuum tubes caused by motion of said loudspeaker means and thereby reduce undesired tube microphonics to a minimum.

4. A system as defined in claim 3 wherein said chassis includes a wall disposed between said loudspeaker means and said vacuum tubes, said wall including a very major portion which is uninterrupted and free of holes to shield the tubes and minimizing impingement upon said vacuum tubes of air pressure waves generated by motion of said loudspeaker means.

5. A sound amplifier system comprising a housing having an upper portion, a lower portion, a front portion and a back portion, said lower portion having a substantially horizontally disposed support surface thereof for supporting the housing in operative position, loudspeaker means supported by said housing, said loudspeaker means having a main axis of motion, amplifier means supported by said housing, said amplifier means including a plurality of vacuum tubes including power amplifier tubes and preamplifier tubes, each of said tubes having a longitudinal axis along which the tube has maximum strength and rigidity, the longitudinal axes of all of said vacuum tubes being substantially parallel with one another and with said support surface and also being disposed substantially parallel with a vertical plane passing through said axis of the loudspeaker means so as to minimize movement of said internal elements of the vacuum tubes caused by motion of said loudspeaker means and thereby reduce undesired tube microphonics to a minimum.

6. A system as defined in claim 5 wherein the longitudinal axes of all of said tubes are disposed adjacent said upper portion of the housing, said loudspeaker means being supported a substantial distance below said upper portion of the housing to space said loudspeaker means a substantial distance below said tubes.

7. A system as defined in claim 6 wherein said tubes are disposed adjacent said rear portion of the housing, said amplifier means including control means disposed adjacent the front portion of said housing.

8. A system as defined in claim 5 wherein said amplifier means includes a chassis supported by said housing, said chassis including a wall disposed between said loudspeaker means and said vacuum tubes, said wall including a very major portion which is uninterrupted and free of holes to shield the tubes and minimizing impingement upon said vacuum tubes of air pressure waves generated by motion of said loudspeaker means.

* * * * *